United States Patent [19]
Cho et al.

[11] Patent Number: 5,734,730
[45] Date of Patent: Mar. 31, 1998

[54] APPARATUS FOR ADJUSTING A FREQUENCY CHARACTERISTIC OF AN AUDIO SIGNAL ACCORDING TO BIORHYTHM PRINCIPLES

[75] Inventors: Ki-young Cho; Hong-ki Kim, both of Suwon, Rep. of Korea

[73] Assignee: Samsung Electronics Co., Ltd., Kyungki-Do, Rep. of Korea

[21] Appl. No.: 422,836

[22] Filed: Apr. 17, 1995

[30] Foreign Application Priority Data

Apr. 16, 1994 [KR] Rep. of Korea ............... 1994-7999

[51] Int. Cl.⁶ ............................................. H03G 5/00
[52] U.S. Cl. ............................. 381/103; 381/98; 600/27
[58] Field of Search ............................. 381/103, 98, 104, 381/107; 600/27; 364/413.01

[56] References Cited

U.S. PATENT DOCUMENTS

| | | | |
|---|---|---|---|
| 4,184,202 | 1/1980 | McCrae | 364/413.01 |
| 4,289,121 | 9/1981 | Kupriyanovich | 600/27 |
| 5,450,312 | 9/1995 | Lee et al. | 381/103 |
| 5,581,621 | 12/1996 | Koyama et al. | 381/98 |

Primary Examiner—Curtis Kuntz
Assistant Examiner—Xu Mei
Attorney, Agent, or Firm—Sughrue, Mion, Zinn, Macpeak & Seas, PLLC

[57] ABSTRACT

An apparatus adjusts the frequency characteristic of an audio signal output corresponding to changes in an individual's biorhythms. The apparatus is composed of a key input unit for receiving biorhythm parameters, a ROM for storing a frequency-characteristic adjustment pattern corresponding to a biorhythm change and for selectively outputting the adjustment pattern for each rhythm corresponding to an applied intellectual rhythm, physical rhythm and emotional or sensitivity rhythm as a function of time, a controller for determining the intellectual rhythm, physical rhythm and emotional or sensitivity rhythm for the current day based on parameters input through the key input unit, providing the determination to the ROM and outputting a control signal corresponding to the adjustment pattern output from the ROM, and a frequency-characteristic adjuster for adjusting the frequency characteristic of an audio signal responding to the control signal output from the controller. The apparatus improves aural satisfaction by adjusting the frequency characteristic of an audio signal output according to the user's biorhythm.

21 Claims, 7 Drawing Sheets

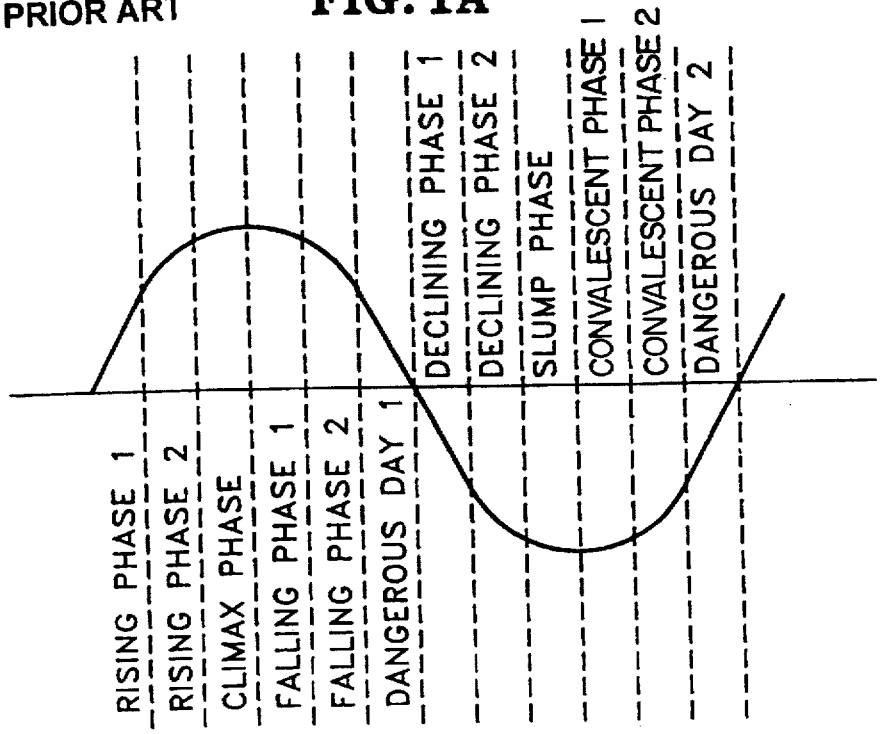

| BIORHYTHM POSITION OF CURRENT DAY | MOST SUITABLE ADJUSTMENT PATTERN | | |
|---|---|---|---|
| | PHYSICAL RHYTHM | SENSITIVITY MOTION RHYTHM | INTELLECTUAL RHYTHM |
| RISING PHASE 1 | JAZZ | HEADPHONE | JAZZ |
| RISING PHASE 2 | POP | ROCK | ROCK |
| CLIMAX PHASE | ROCK | CLASSICAL | POP |
| FALLING PHASE 1 | ROCK | JAZZ | ROCK |
| FALLING PHASE 2 | POP | POP | JAZZ |
| DANGEROUS DAY 1 | CLASSICAL | CLASSICAL | CLASSICAL |
| DECLINING PHASE 1 | JAZZ | HEADPHONE | HEADPHONE |
| DECLINING PHASE 2 | HEADPHONE | JAZZ | JAZZ |
| SLUMP PHASE | CLASSICAL | CLASSICAL | CLASSICAL |
| CONVALESCENT PHASE 1 | HEADPHONE | JAZZ | JAZZ |
| CONVALESCENT PHASE 2 | JAZZ | POP | HEADPHONE |
| DANGEROUS DAY 2 | CLASSICAL | CLASSICAL | CLASSICAL |

| | STATE | ADJUSTMENT PATTERN |
|---|---|---|
| A | BODILY HIGH, SELF-CONFIDENT, BUT NERVOUS AND QUARRELSOME | ROCK, HEADPHONE |
| B | CLEAR HEAD, PREPARED TO BE BODILY ACTIVE, AND NEEDING REPOSE | JAZZ, POP |
| C | NEEDING BODILY REPOSE, INTELLECTUALLY OBTUSE, BUT FEELING RISING | JAZZ, HEADPHONE | ial
APPARATUS FOR ADJUSTING A FREQUENCY CHARACTERISTIC OF AN AUDIO SIGNAL ACCORDING TO BIORHYTHM PRINCIPLES

BACKGROUND OF THE INVENTION

The present invention relates to an apparatus for adjusting the frequency characteristic of an audio signal, and more particularly, to an apparatus for adjusting the frequency characteristic of an audio signal based on human biorhythmic principles.

In biorhythm theory, a person's intrinsic rhythmic patterns are classified into those for the physical being (i.e. physical rhythms); the intelligent being (i.e. intellectual rhythms); and the sensitive or emotional being (i.e. sensitivity or emotional rhythms). It has been asserted that the respective cycles of these biorhythms are 23, 33 and 28 days, respectively. Thus, these biorhythms have a predetermined phase relationship with respect to each other. Each of these rhythms is repeated in sinusoidal fashion, as calculated using a method proposed by Hans Furis.

There also has been a study of relationships between biorhythms and an individual's aural distinction (see *Biorhythms*, by Park Eun-sook and Park Eun-joo, Apr. 10, 1983). In this study, the authors concluded that the frequency characteristic of an audio signal providing the most suitable aural satisfaction to a person also varies according to changes in the person's biorhythm.

FIGS. 1A and 1B show how frequency characteristics of an audio signal which provide the most suitable aural satisfaction vary according to biorhythmic (periodic) changes. Looking at these figures in detail, FIG. 1A shows the division of one cycle of a biorhythmic pattern into twelve sections. As shown in FIG. 1B, each section may have a corresponding frequency-characteristic adjustment pattern such as jazz, pop, rock, classical and headphone. In this case, these classifications are made on the basis of the musical range of the instrument which is being employed primarily, and of the particular frequency band being emphasized.

FIG. 2 shows a practical example of a musical range of an instrument. For example, the musical range of a piccolo is from 523.25 Hz through 3951.07 Hz, while the musical range of a contrabass is from 41.20 Hz through 246.94 Hz.

For pop mode, the output is emphasized for frequencies above around 1000 Hz, and for the headphone mode, the low and high frequency bands rather than a mid-range band are emphasized. Accordingly, the low musical range of a piccolo is emphasized by adjusting an output audio signal to an adjustment pattern of pop, and the low musical range of a contrabass and the high musical range of a piccolo are emphasized by the adjustment pattern of the headphone mode.

Looking at a more detailed example, FIG. 3A shows a person's sample biorhythm, composed of an emotional or sensitivity rhythm, a physical rhythm, and an intelligence rhythm. Points A, B, and C are identified in this Figure. FIG. 3B shows the most suitable frequency-characteristic adjustment pattern for each of positions A, B, and C. When a person's biorhythm is at position A, that person is said to be physically "high" and self-confident, but rather nervous and quarrelsome. Looking back at FIGS. 1A and 1B, it can be seen that the frequency-characteristic adjustment pattern that is most suitable for the physical rhythm of the person experiencing position A of his/her biorhythm is rock, while jazz and headphone are most suitable for the intellectual rhythm and sensitivity rhythm, respectively. Considering the dominance of each rhythm's influence, the frequency characteristic suitable for the person at position A can be rock and headphone corresponding to the physical rhythm or sensitivity rhythm.

Looking at position B in FIG. 3A, the person's intelligence rhythm is near a high, but is in falling phase 2, corresponding to jazz. The physical rhythm is in slump phase, corresponding to classical, and the emotional or sensitivity rhythm is in coalescent phase 2, corresponding to pop. Considering the dominance of each rhythm's influence, the frequency characteristic suitable for the person at position B can be jazz and pop corresponding to the intelligence and emotional rhythms.

At position C, physical repose is needed, and he/she is obtuse (i.e. not as sharp) intellectually, but entering a good emotional phase. Accordingly, the frequency-characteristic adjustment pattern suitable for the person of position C may be jazz or headphone.

Conventional audio apparatus, such as a cassette tape recorder, a compact disc player, a laser disc player, a television set, a video-song accompaniment apparatus, etc., have lacked an ability to adjust the frequency characteristic of an audio signal to the most suitable frequency characteristic according to a user's physical state. This is because these devices have not taken biorhythms into consideration as part of their operation.

SUMMARY OF THE INVENTION

To solve the foregoing and other problems, it is an object of the present invention to provide an apparatus for adjusting the frequency characteristic of an audio signal according to a biorhythm so that a user can be provided the most suitable aural satisfaction based on the user's physical state.

To achieve the above and other objects, an apparatus for adjusting the frequency characteristic of an audio signal is constituted by: a key input unit for inputting biorhythm parameters; a ROM for storing a frequency-characteristic adjustment pattern corresponding to changes in a listener's biorhythm, and for selectively outputting an adjustment pattern for each time axis position of an intellectual rhythm, a physical rhythm, and a sensitivity rhythm; a controller for determining the intellectual rhythm, the physical rhythm and the sensitivity rhythm based on current date information and parameters input through the key input unit, providing the determined rhythms to the ROM, and outputting a control signal corresponding to the adjustment pattern output from the ROM; and a frequency-characteristic adjuster for adjusting the frequency characteristic of an audio signal in response to the control signal output from the controller.

BRIEF DESCRIPTION OF THE DRAWINGS

The foregoing and other objects and advantages of the present invention will become more apparent in the following detailed description of a preferred embodiment of the invention, with reference to the accompanying drawings, in which:

FIG. 1A is a view illustrating a biorhythm being divided into plural sections;

FIG. 1B is a view showing a frequency-characteristic adjustment pattern suitable for each section shown in FIG. 1A;

DETAILED DESCRIPTION OF A PREFERRED EMBODIMENT

Figure 4:
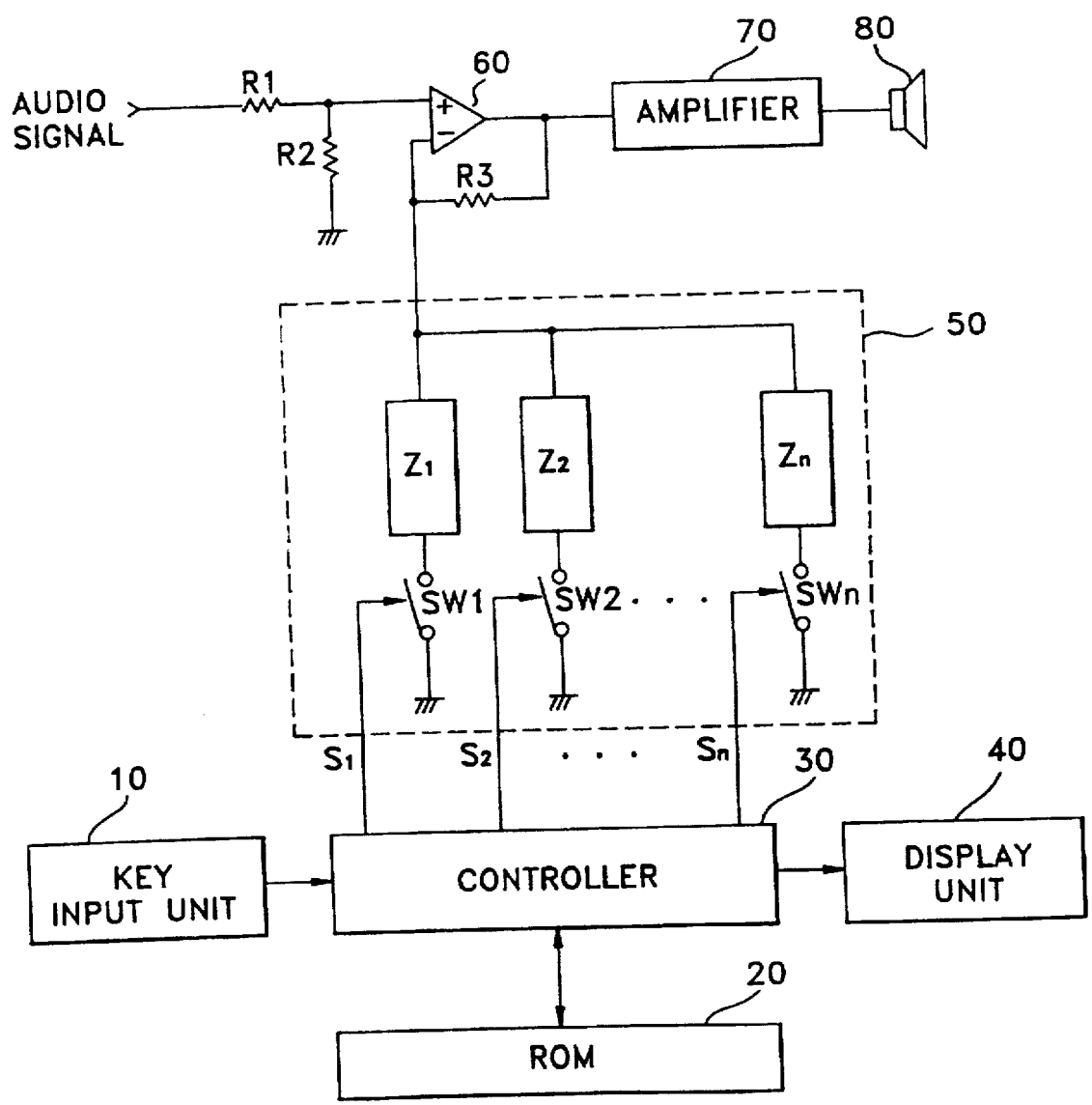
FIG. 4 is a block diagram illustrating a preferred embodiment of the present invention.

In FIG. 4, which is a block diagram showing a preferred embodiment of the present invention, the inventive apparatus is constituted by a key input unit 10, a ROM 20, a controller 30, a display unit 40, a frequency-characteristic adjuster 50, a differential amplifier 60, a amplifier 70 and a speaker 80.

Through key input unit 10, a user inputs biorhythm parameters such as birthday, name, etc. ROM 20 stores a frequency-characteristic adjustment pattern corresponding to changes in biorhythm and selectively outputs the adjustment pattern corresponding to a given position on a time axis for each of the three above-mentioned rhythms (i.e. intellectual rhythm, physical rhythm and sensitivity rhythm). Controller 30 determines the intellectual rhythm, physical rhythm and sensitivity rhythm for the current day based on date information and the parameters input through key input unit 10. The controller 30 provides the determined rhythms to the ROM 20, receives an adjustment pattern from the ROM 20 in response, and outputs a control signal corresponding to the adjustment pattern output from the ROM 20.

Display unit 40 displays the adjustment pattern output from ROM 20 by converting the pattern into visual information. Frequency-characteristic adjuster 50 adjusts the frequency characteristic of an audio signal in response to the control signal output from controller 30 over lines $S_1, \ldots, S_n$. The frequency-characteristic adjuster 50 is composed of plural impedance circuits $Z_1-Z_n$, each having one end connected in common to an audio signal transmission line at an output of frequency-characteristic adjuster 50, and plural switches $SW_1-SW_n$, each having one terminal respectively connected to the other ends of impedance circuits $Z_1-Z_n$, the other terminals of the switches being grounded. The switches are turned on and off by the control signal output from controller 30 on lines $S_1-S_n$, as mentioned above.

Differential amplifier 60 has a non-inverting input which receives an audio signal via voltage divider R1, R2 at its non-inverting input, and an inverting input which receives the output of frequency-characteristic adjuster 50 via negative feedback connection through resistor R3. The output of differential amplifier 60 is an amplified difference between the signals received at the just-mentioned inputs. This amplified difference is provided to amplifier 70 as an input, the output of amplifier 70 being provided to speaker 80.

Figure 5:
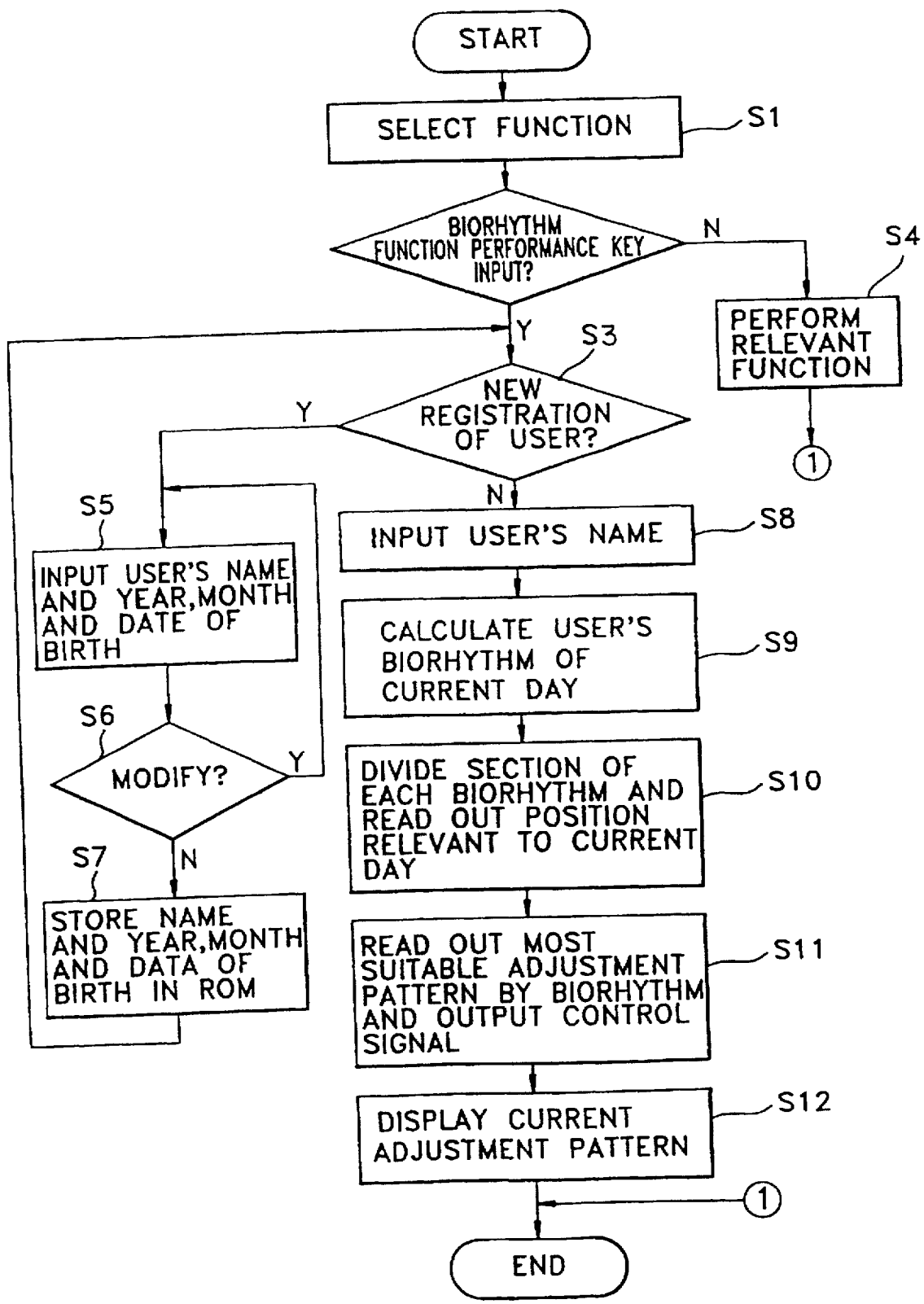
FIG. 5 is a flowchart illustrating a method of adjusting the frequency characteristic of an audio signal according to changes in biorhythm using the apparatus shown in FIG. 4.

FIG. 5 is a flowchart which will help to explain one method of controlling the apparatus shown in FIG. 4. There are two ways of providing the necessary birthdate (day, month and year) information for a user. One way would be to input this information whenever the audio device is in use. The other way would be to store this information beforehand. The flowchart of FIG. 5 describes the second of these approaches.

In step S1 of FIG. 5, a user selects an audio output function. In step S2, selection of a biorhythm processing function key is determined. If the function key has been selected, a key signal for instructing a biorhythm function is transmitted from key input unit 10 to controller 30. If the key is not selected in step S2, the process proceeds to step S4 where the action corresponding to the operated key is performed by controller 30.

In step S3, the controller 30 checks whether a new user is registering his/her biorhythm. If there is a new registration, the user is prompted to input a name and birth year, month and date. This exchange is displayed through display unit 40 in step S5.

Once the information has been input, in step S6, the user is given the opportunity to modify the information if necessary. Flow goes back to step S5 if modification indeed is necessary. Once the correct information has been input, flow continues to step S7, in which the input name and the birth year, month and date are stored in ROM 20. Flow then returns to step S3 to see if there is another user who is to be registered.

If there are no more new users to be registered, the controller operation advances to step S8 to request the current user to input his/her name. Responding to the prompt (which is received via display 40,) the user inputs his/her name. Controller 30 reads the birth year, month and date data corresponding to the input name by referring to the contents stored in ROM 20.

In step S9, controller 30 calculates a biorhythm for the current day by using a well-known method such as that proposed by Hans Furis, as mentioned earlier. Current day information can be input at the time the biorhythm is to be calculated; alternatively, a clock internal to controller 30 may keep track of current day and date information. In step S10, the controller reads an adjustment pattern corresponding to the current day's biorhythm from the frequency-characteristic adjustment pattern stored in ROM 20.

In step S11, controller 30 outputs control signals $S_1$ to $S_n$, corresponding to the produced adjustment pattern, to frequency-characteristic adjuster 50. Controller 30 also outputs through display unit 40 information relating to the selected adjustment pattern so that the user can recognize the frequency characteristic of the currently output audio signal.

The control signals $S_1$ to $S_n$ output from controller 30 control the on-and-off state of switches $SW_1-SW_n$. When the corresponding control signal goes active, the switch to which the control signal is applied becomes closed and an impedance circuit affects the frequency characteristic of an audio signal by providing a suitable output to differential amplifier 60.

For example, if the selected adjustment pattern corresponding to the biorhythm of the current day is for a headphone mode, controller 30 generates a control signal which causes frequency-characteristic adjuster to provide a signal which enhances the low and high bands rather than the mid-range band of the audio signal. The signal output from frequency-characteristic adjuster 50 is applied to the inverting input of differential amplifier 60, and is used as a reference. An audio signal whose frequency characteristic is not adjusted, but which is frequency-divided by resistors R1 and R2, is applied to the non-inverting input of differential amplifier 60. As discussed earlier with reference to FIG. 4, the output of differential amplifier 60 represents an amplified comparison between the signals at the inverting and non-inverting inputs of that amplifier. In this manner, an audio signal having the frequency characteristic set by frequency-characteristic adjuster 50 is output. The audio signal is output as a sound signal through amplifier 70 and speaker 80.

Figure 6:
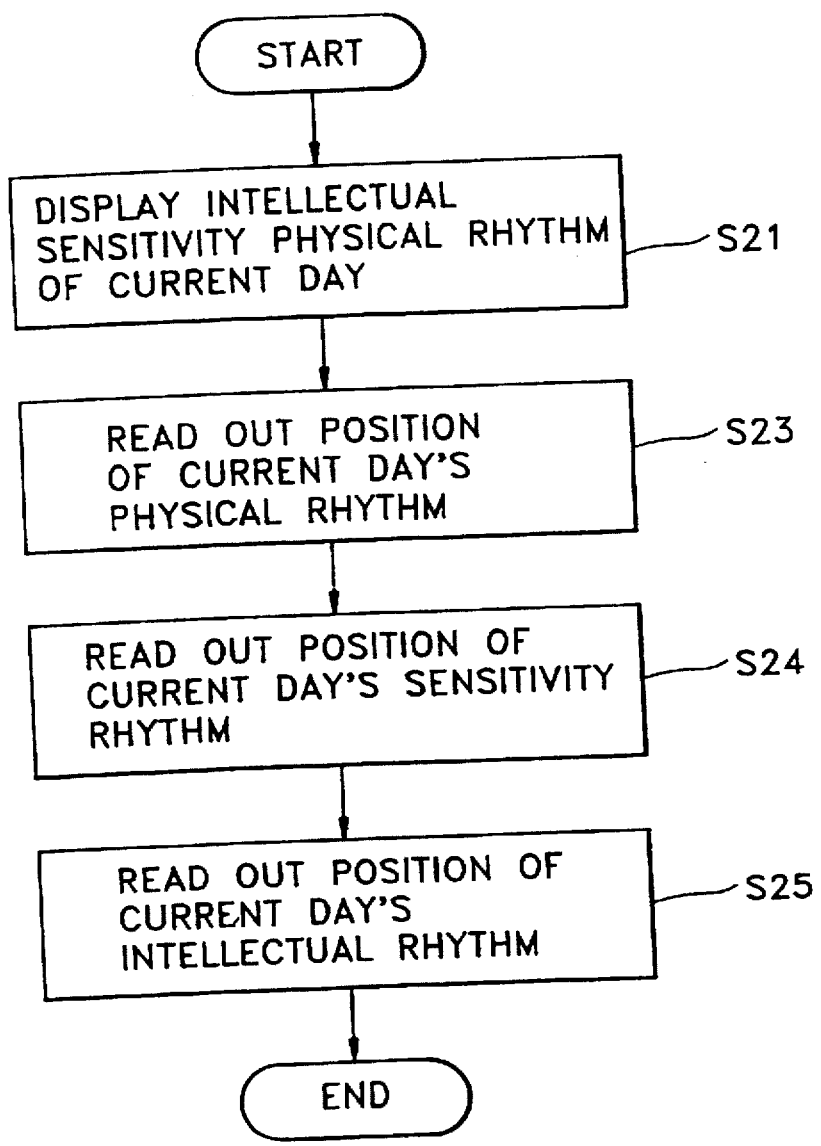
FIG. 6 is a flowchart detailing step S10 in FIG. 5.

FIG. 6 is a flowchart showing the read-out of each position corresponding to a user's biorhythm for the current day. In step S21, a biorhythm produced from step S9 in FIG. 5 is displayed through display unit 40 as visual information which the a user can recognize. In step S23, the current day's section corresponding to physical rhythm among the sections shown in FIG. 1 is read out. In the same way, the sensitivity and intellectual rhythms falling under the current day are read out in steps S24 and S25, respectively.

After performing the processes shown in FIG. 6, controller 30 selects the most suitable frequency-characteristic adjustment pattern for the current day's biorhythm, and outputs the corresponding control signal on lines $S_1$-$S_n$.

Figure 7:
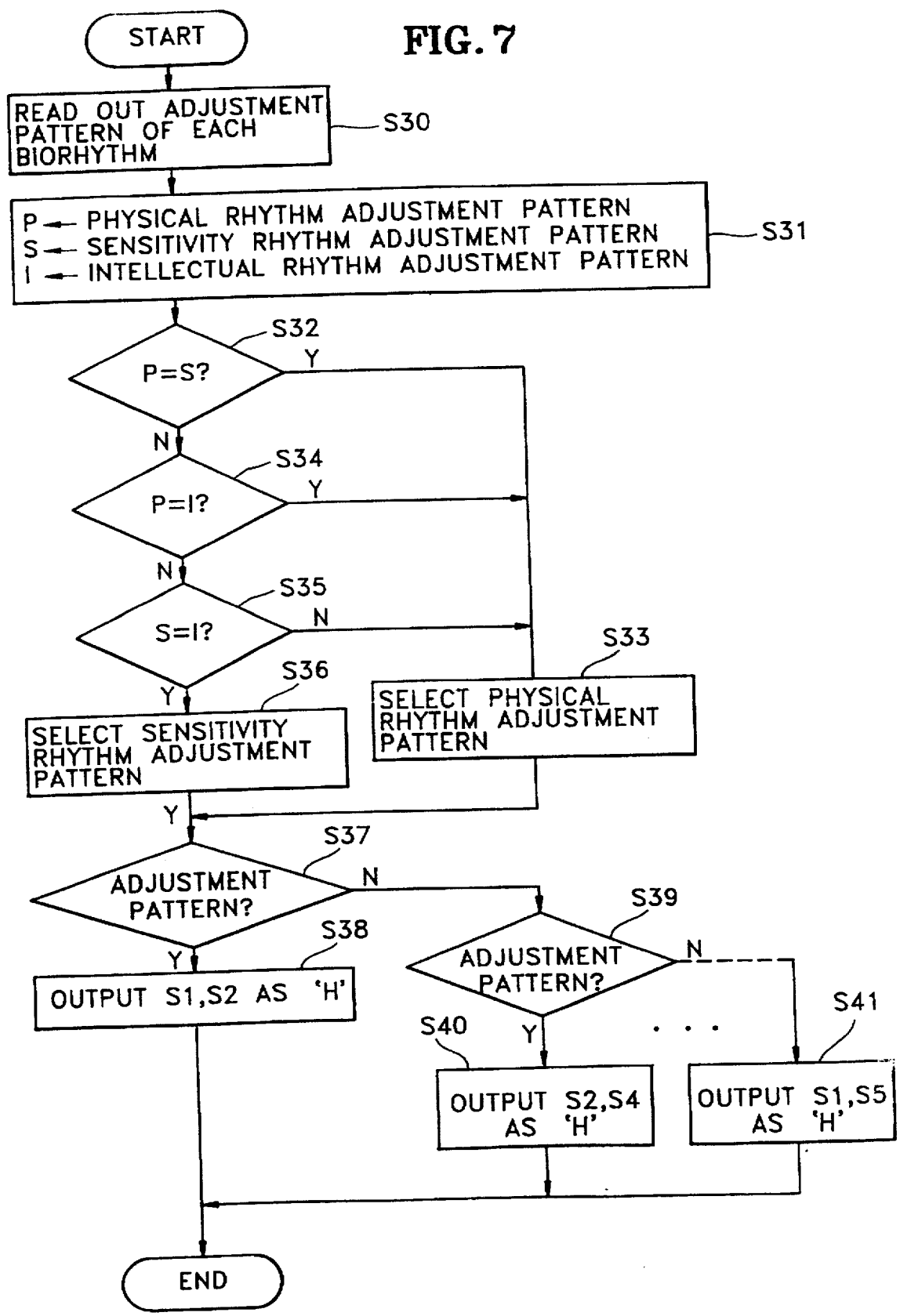
FIG. 7 is a flowchart detailing step S11 in FIG. 5.

FIG. 7 is a flowchart showing the selection of the most suitable frequency-characteristic adjustment pattern, and the outputting of the control signal corresponding to the selected pattern. In step S30, referring to the contents stored in ROM 20, controller 30 reads out the frequency-characteristic adjustment pattern corresponding to each section falling under the current day's physical, sensitivity and intellectual rhythmic cycles.

Controller 30 selects the most suitable of the frequency-characteristic adjustment patterns, these being preset according to each rhythm. Here, if more than two frequency-characteristic adjustment patterns are output simultaneously, the necessary adjustment to the frequency characteristic of an audio signal becomes unclear, so that maximum aural satisfaction cannot be achieved. Therefore, in accordance with the selection rule of the present invention, when two or more selected adjustment patterns among the three frequency-characteristic adjustment patterns are in congruence (i.e. the patterns at that given point in the respective rhythms point toward the same type of audio signal adjustment to be made,) the congruent pattern is selected as the most suitable frequency-characteristic adjustment pattern. If none of the patterns is in congruence with each other, then in step S33 the physical rhythm is given priority, and the adjustment pattern for that rhythm is selected.

Looking more closely at the flow in FIG. 7, in step S32, frequency-characteristic adjustment pattern P (physical rhythm) is compared with frequency-characteristic adjustment pattern S (sensitivity rhythm). If the two rhythms are in congruence (i.e. indicate the same audio signal adjustment to be made,) the frequency-characteristic adjustment pattern P is set up as the most suitable adjustment pattern in step S33.

If patterns P and S are determined not to be in congruence, frequency-characteristic adjustment patterns P and I (intellectual rhythm) are compared in step S34 to determine whether these two patterns are in congruence. If they are, then again the frequency-characteristic adjustment pattern P is set up as the most suitable adjustment pattern in step S33. If they are not, then patterns S and I are compared in step S35. If these two patterns are not in congruence, then the physical pattern P is given priority in step S33. If the two patterns are in congruence, then the sensitivity pattern S is selected in step S36.

In the following steps S37–S41, control signals $S_1$-$S_n$ are output according to the set most suitable frequency-characteristic adjustment pattern.

Figure 2:
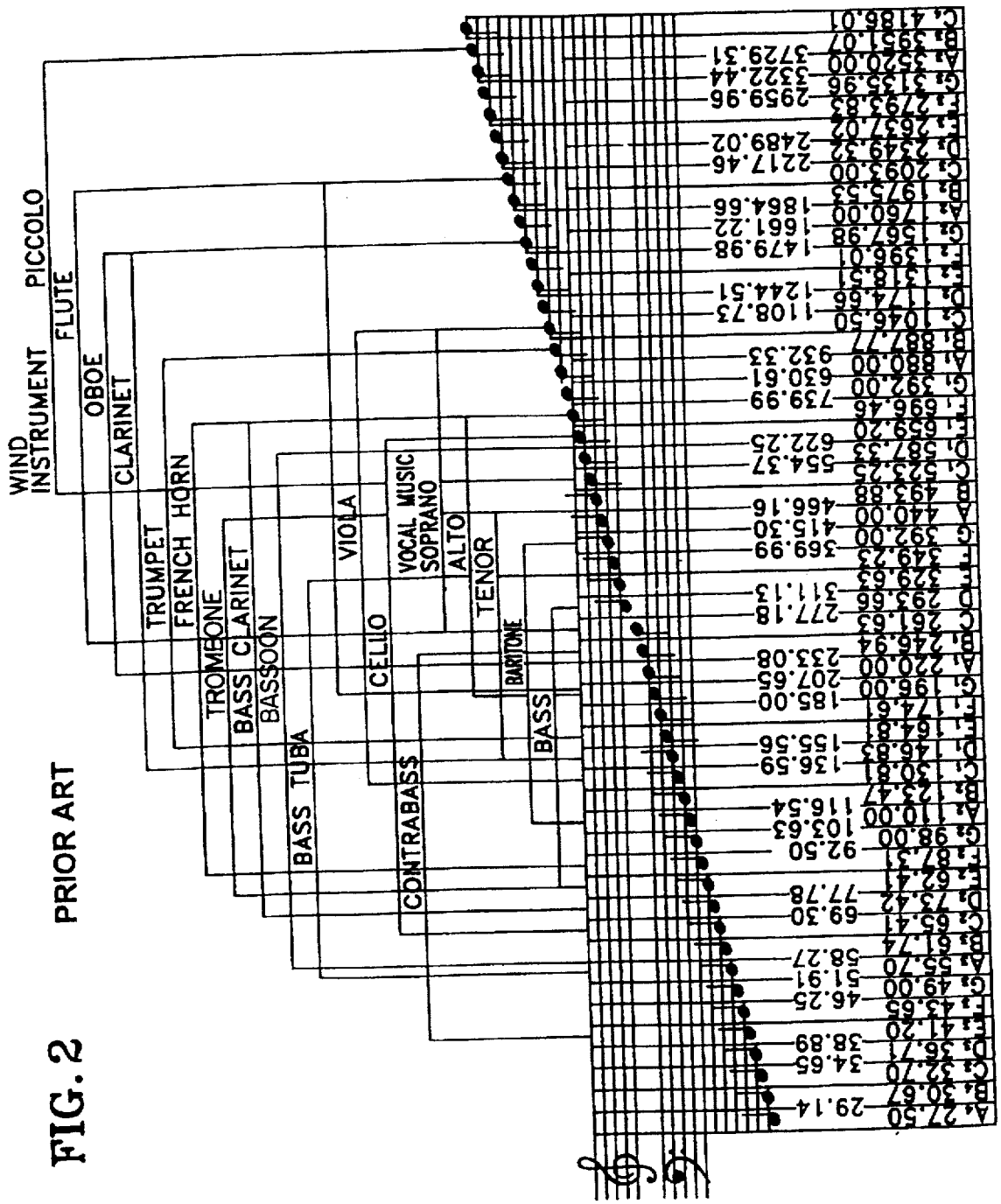
FIG. 2 is a view illustrating a musical range according to each kind of instrument and vocal music.
Figures 3A, 3B:
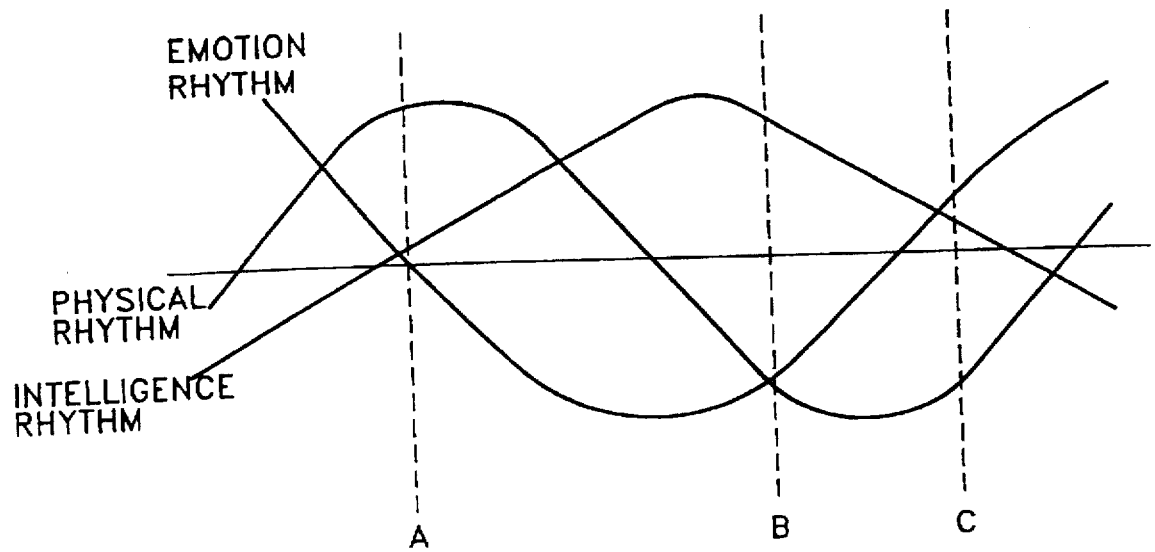
FIG. 3A is a view illustrating changes in physical rhythm, intellectual rhythm and sensitivity rhythm.
FIG. 3B is a view illustrating the most suitable frequency-characteristic adjustment pattern corresponding to positions A, B, and C in FIG. 3A.

For example, looking at the position C in FIG. 3A, the headphone mode is set up in step S33 because the frequency-characteristic adjustment pattern of the physical rhythm and that of the sensitivity rhythm are the same. Controller 30 sets up control signals $S_1$ and $S_2$ as a high-level state through steps S37 and S38. Accordingly, the first and second switches $SW_1$ and $SW_2$ of frequency-characteristic adjuster 50 become closed, and first and second impedances $Z_1$ and $Z_2$ affect the frequency characteristic of the input audio signal. Consequently, the frequency characteristic of the output audio signal changes to a headphone pattern, which has been described above.

Other patterns, such as rock, jazz, classical, and pop, may be used to affect the frequency characteristic of the output audio signal by closing different combinations of switches, as described generally with reference to steps S39 to S41. Correspondence between particular switch combinations and audio patterns is arbitrary. Thus, while closing of switches $S_1$ and $S_2$ has been made to correspond to a headphone pattern in this embodiment, different combinations, in accordance with the number of switches and audio patterns, clearly are possible.

As described above, an apparatus for adjusting the frequency characteristic of an audio signal according to the present invention has an effect of improving a user's aural satisfaction by adjusting the frequency characteristic of an audio signal according to the user's biorhythm.

In the foregoing embodiment, though a frequency-characteristic adjuster is connected in parallel with a line for transmitting an audio signal, the adjuster can be connected in series without detracting from the overall function of the present invention.

While the invention has been described in detail with reference to a preferred embodiment, various modifications within the scope of the appended claims will be apparent to those of working skill in this technological field.

What is claimed is:

1. An apparatus for providing an adjustment to a frequency characteristic of an input audio signal, said adjustment corresponding to a change in a listener's biorhythm, said biorhythm being constituted by an intellectual rhythm, a physical rhythm, and an emotional rhythm, said apparatus comprising:

a key input unit for inputting biorhythm parameters;

a controller for determining the intellectual rhythm, the physical rhythm, and the emotional rhythm as a function of time, according to the biorhythm parameters input through said key input unit;

a ROM for storing frequency-characteristic adjustment patterns corresponding to changes in biorhythm, and for selectively outputting said frequency-characteristic adjustment patterns as a function of time in response to receipt from said controller of the determined intellectual rhythm, physical rhythm, and emotional rhythm, said controller outputting a control signal corresponding to said frequency-characteristic adjustment patterns; and a frequency characteristic adjuster, responsive to the control signal output by said controller, for adjusting the frequency characteristic of said input audio signal;

wherein said frequency-characteristic adjuster comprises plural impedance circuits having two ends, one end of each of said plural impedance circuits being connected in common to an audio signal transmission line, and plural switches having two terminals, said switches being turned on and off by the control signal output from said controller, one terminal of each of said switches being connected respectively to the other ends of said impedance circuits, the other terminal of each of said switches being grounded.

2. An apparatus as claimed in claim 1, wherein said frequency-characteristic adjustment patterns stored in said ROM are made by dividing one cycle of a biorhythm into a plurality of sections and selecting the frequency characteristic of an output audio signal suitable for each section.

3. An apparatus as claimed in claim 2, wherein all of said plurality of sections have the same sectional width.

4. An apparatus as claimed in claim 1, wherein said controller generates a control signal according to a determination of whether two or more of the adjustment patterns output by the ROM for the physical rhythm, the intellectual rhythm, and the emotional rhythm are the same.

5. An apparatus as claimed in claim 4, wherein said controller generates a control signal according to an adjustment pattern corresponding to the physical rhythm, if the controller determines that none of the adjustment patterns is the same.

6. An apparatus as claimed in claim 1, further comprising a differential amplifier receiving said input audio signal and an output of said frequency-characteristic adjuster and providing an amplified difference signal accordingly, said plural impedance circuits of said frequency-characteristic adjuster being connected in common to said output of said frequency-characteristic adjuster.

7. An apparatus as claimed in claim 1, further comprising a display unit for displaying the adjustment pattern output from said ROM as visual information.

8. An apparatus as claimed in claim 1, wherein said key input unit includes keys for enabling a user to input identifying information and birth information so as to enable the controller to calculate the user's biorhythm, said ROM storing said birth information in accordance with said identifying information.

9. An apparatus as claimed in claim 1, wherein said frequency-characteristic adjustment patterns emphasize different ranges of frequencies in a listener's audio spectrum.

10. An apparatus as claimed in claim 1, wherein said intellectual rhythm, said physical rhythm, and said emotional rhythm have fixed frequencies.

11. An apparatus as claimed in claim 10, wherein said intellectual rhythm, said physical rhythm, and said emotional rhythm have periods of approximately 33 days, 23 days, and 28 days, respectively.

12. An apparatus for providing an adjustment to a frequency characteristic of an input audio signal, said adjustment corresponding to a change in a listener's biorhythm, said biorhythm being constituted by an intellectual rhythm, a physical rhythm, and an emotional rhythm, said apparatus comprising:

a key input unit for inputting biorhythm parameters;

a controller for determining the intellectual rhythm, the physical rhythm, and the emotional rhythm as a function of time, according to the biorhythm parameters input through said key input unit;

a ROM for storing frequency-characteristic adjustment patterns corresponding to changes in biorhythm, and for selectively outputting said frequency-characteristic adjustment patterns as a function of time in response to receipt from said controller of the determined intellectual rhythm, physical rhythm, and emotional rhythm, said controller outputting a control signal corresponding to said frequency-characteristic adjustment patterns; and a frequency characteristic adjuster, responsive to the control signal output by said controller, for adjusting the frequency characteristic of said input audio signal;

wherein said frequency-characteristic adjuster comprises plural impedance circuits each having two ends, one end of each of said plural impedance circuits being connected in common for receiving an audio signal, and plural switches having two terminals, said switches being turned on and off by the control signal output from said controller, one terminal of each of said switches being connected respectively to the other ends of said impedance circuits, and the other terminals being connected in common for outputting an audio signal.

13. An apparatus for providing an adjustment to a frequency characteristic of an input audio signal, said adjustment corresponding to a change in a listener's biorhythm, said biorhythm being constituted by an intellectual rhythm, a physical rhythm, and an emotional rhythm, said apparatus comprising:

a controller for determining the intellectual rhythm, the physical rhythm, and the emotional rhythm as a function of time, according to biorhythm parameters;

a memory device for storing frequency-characteristic adjustment patterns corresponding to changes in biorhythm, and for selectively outputting said frequency-characteristic adjustment patterns as a function of time in response to receipt from said controller of the determined intellectual rhythm, physical rhythm, and emotional rhythm, said controller outputting a control signal corresponding to said frequency-characteristic adjustment patterns; and a frequency-characteristic adjuster, responsive to the control signal output by said controller, for adjusting the frequency characteristic of said input audio signal;.

wherein said frequency-characteristic adjuster comprises plural impedance circuits having two ends, one end of each of said plural impedance circuits being connected in common to an audio signal transmission line, and plural switches having two terminals, said switches being turned on and off by the control signal output from said controller, one terminal of each of said switches being connected respectively to the other ends of said impedance circuits, the other terminal of each of said switches being grounded.

14. An apparatus as claimed in claim 13, wherein said frequency-characteristic adjustment patterns stored in said memory device are made by dividing one cycle of a biorhythm into a plurality of sections and selecting the frequency characteristic of an output audio signal suitable for each section.

15. An apparatus as claimed in claim 14, wherein all of said plurality of sections have the same sectional width.

16. An apparatus as claimed in claim 13, wherein said controller generates a control signal according to a determination of whether two or more of the adjustment patterns output by the memory device for the physical rhythm, the intellectual rhythm, and the emotional rhythm are the same.

17. An apparatus as claimed in claim 16, wherein said controller generates a control signal according to an adjustment pattern corresponding to the physical rhythm, if the controller determines that none of the adjustment patterns is the same.

18. An apparatus as claimed in claim 13, further comprising a differential amplifier receiving said input audio signal and an output of said frequency-characteristic adjuster and providing an amplified-difference signal accordingly, said plural impedance circuits of said frequency-characteristic adjuster being connected in common to said output of said frequency characteristic adjuster.

19. An apparatus as claimed in claim 13, wherein said intellectual rhythm, said physical rhythm, and said emotional rhythm have fixed frequencies.

20. An apparatus as claimed in claim 13, wherein said intellectual rhythm, said physical rhythm, and said emotional rhythm have periods of approximately 33 days, 23 days, and 28 days, respectively.

21. An apparatus for providing an adjustment to a frequency characteristic of an input audio signal, said adjustment corresponding to a change in a listener's biorhythm, said biorhythm being constituted by an intellectual rhythm, a physical rhythm, and an emotional rhythm, said apparatus comprising:

- a controller for determining the intellectual rhythm, the physical rhythm, and the emotional rhythm as a function of time, according to biorhythm parameters;
- a memory device for storing frequency-characteristic adjustment patterns corresponding to changes in biorhythm, and for selectively outputting said frequency-characteristic adjustment patterns as a function of time in response to receipt from said controller of the determined intellectual rhythm, physical rhythm, and emotional rhythm, said controller outputting a control signal corresponding to said frequency-characteristic adjustment patterns; and
- a frequency-characteristic adjuster, responsive to the control signal output by said controller, for adjusting the frequency characteristic of said input audio signal;

wherein said controller generates a control signal according to a determination of whether two or more of the adjustment patterns output by the memory device for the physical rhythm, the intellectual rhythm, and the emotional rhythm are the same, and wherein said frequency-characteristic adjuster comprises plural impedance circuits each having two ends, one end of each of said plural impedance circuits being connected in common for receiving an audio signal, and plural switches having two terminals, said switches being turned on and off by the control signal output from said controller, one terminal of each of said switches being connected respectively the other ends of said impedance circuits, and the other terminals being connected in common for outputting an audio signal.

* * * * *